US012656533B2

(12) United States Patent
Ding et al.

(10) Patent No.: US 12,656,533 B2
(45) Date of Patent: Jun. 16, 2026

(54) OPTICAL ARTICLE COMPRISING A LIGHT ABSORBING COMPOUND AND A CORRESPONDING MANUFACTURING METHOD

(71) Applicant: Essilor International, Charenton-le-pont (FR)

(72) Inventors: Xingzhao Ding, Singapore (SG); Yu Richard Liu, Singapore (SG)

(73) Assignee: Essilor International, Charenton-le-pont (FR)

( * ) Notice: Subject to any disclaimer, the term of this patent is extended or adjusted under 35 U.S.C. 154(b) by 355 days.

(21) Appl. No.: 17/920,108

(22) PCT Filed: Apr. 7, 2021

(86) PCT No.: PCT/EP2021/059007
§ 371 (c)(1),
(2) Date: Oct. 20, 2022

(87) PCT Pub. No.: WO2021/213799
PCT Pub. Date: Oct. 28, 2021

(65) Prior Publication Data
US 2023/0176254 A1 Jun. 8, 2023

(30) Foreign Application Priority Data

Apr. 21, 2020 (EP) ..................................... 20315205

(51) Int. Cl.
*G02B 1/115* (2015.01)
*C23C 14/35* (2006.01)
(Continued)

(52) U.S. Cl.
CPC .............. *G02B 1/115* (2013.01); *C23C 14/35* (2013.01); *G02C 7/02* (2013.01); *G02C 7/10* (2013.01)

(58) Field of Classification Search
CPC ........ G02B 1/115; G02B 5/223; G02B 5/285; C23C 14/35; C23C 14/0042;
(Continued)

(56) References Cited

U.S. PATENT DOCUMENTS

| | | | | |
|---|---|---|---|---|
| 4,896,928 A | * | 1/1990 | Perilloux | ............... G02B 5/285 359/359 |
| 5,719,705 A | * | 2/1998 | Machol | .................. G02B 1/116 359/581 |

(Continued)

FOREIGN PATENT DOCUMENTS

| | | |
|---|---|---|
| CN | 107636495 | 1/2018 |
| DE | 102012112739 | 4/2014 |

(Continued)

OTHER PUBLICATIONS

Extended European Search Report issued in Corresponding European Application No. 20315205.3, dated Oct. 6, 2020.
(Continued)

*Primary Examiner* — Matthew Y Lee
(74) *Attorney, Agent, or Firm* — Norton Rose Fulbright US LLP

(57) ABSTRACT

This optical article comprises a base material having at least one face coated with an interferential multilayer coating providing either antireflective or high reflective properties. The coating comprises at least one layer of light absorbing material which has an adjustable composition and thickness, such that the visible light mean transmission factor of the coating is controllable to have a value between 95% and 5%.

15 Claims, 6 Drawing Sheets

(51) Int. Cl.
G02C 7/02 (2006.01)
G02C 7/10 (2006.01)

(58) Field of Classification Search
CPC ....... C23C 14/0652; C23C 14/10; G02C 7/02;
G02C 7/10; G02C 7/107
See application file for complete search history.

(56) References Cited

U.S. PATENT DOCUMENTS

| | | | |
|---|---|---|---|
| 6,344,288 B1 * | 2/2002 | Oyama | H01J 29/896 |
| | | | 427/535 |
| 6,793,339 B1 * | 9/2004 | Yip | G02B 1/14 |
| | | | 359/360 |
| 7,736,742 B2 | 6/2010 | Thomas et al. | |
| 10,481,413 B2 | 11/2019 | Höfener et al. | |
| 2001/0010288 A1 | 8/2001 | Vanderstraeten | |
| 2002/0090521 A1 * | 7/2002 | Nakajima | G02B 1/115 |
| | | | 428/446 |
| 2005/0186482 A1 * | 8/2005 | Maschwitz | C03C 17/3639 |
| | | | 430/1 |
| 2007/0155137 A1 | 7/2007 | Joshi et al. | |
| 2007/0178315 A1 * | 8/2007 | Thomas | G02B 5/205 |
| | | | 428/432 |
| 2011/0081532 A1 * | 4/2011 | Lu | C03C 17/3435 |
| | | | 428/216 |
| 2016/0023942 A1 | 1/2016 | Mahieu | |
| 2018/0067338 A1 | 3/2018 | Höfener et al. | |
| 2020/0096687 A1 | 3/2020 | Ma et al. | |

FOREIGN PATENT DOCUMENTS

| | | |
|---|---|---|
| EA | 030587 | 8/2018 |
| EP | 2416183 | 2/2012 |
| JP | 410230558 | 9/1997 |
| JP | 2017161893 | 9/2017 |

OTHER PUBLICATIONS

International Search Report and Written Opinion issued in Corresponding PCT Application No. PCT/EP2021/059007, dated Jul. 2, 2021.

Office Action issued in corresponding Chinese Application No. 202180028775.8, dated Sep. 28, 2023.

Xu et al., "Optical investigation of silicon nitride thin films deposited by r.f. magnetron sputtering", *Thin Solid Films, Elsevier*, vol. 425, No. 1-2, Feb. 2003, pp. 196-202.

Office Action issued in corresponding Brazilian Application No. BR112022021239-9, dated Mar. 3, 2026 (English Translation).

* cited by examiner

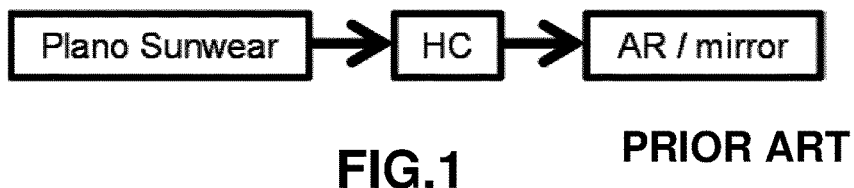
FIG.1    PRIOR ART
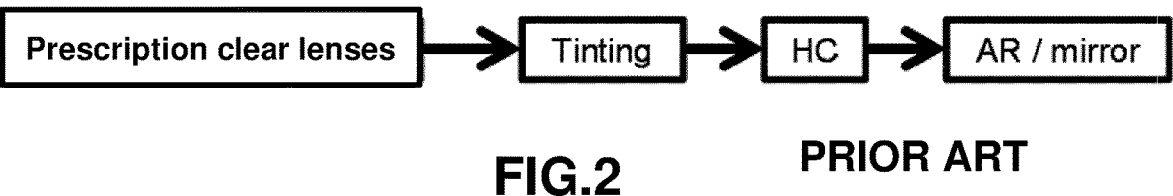
FIG.2    PRIOR ART
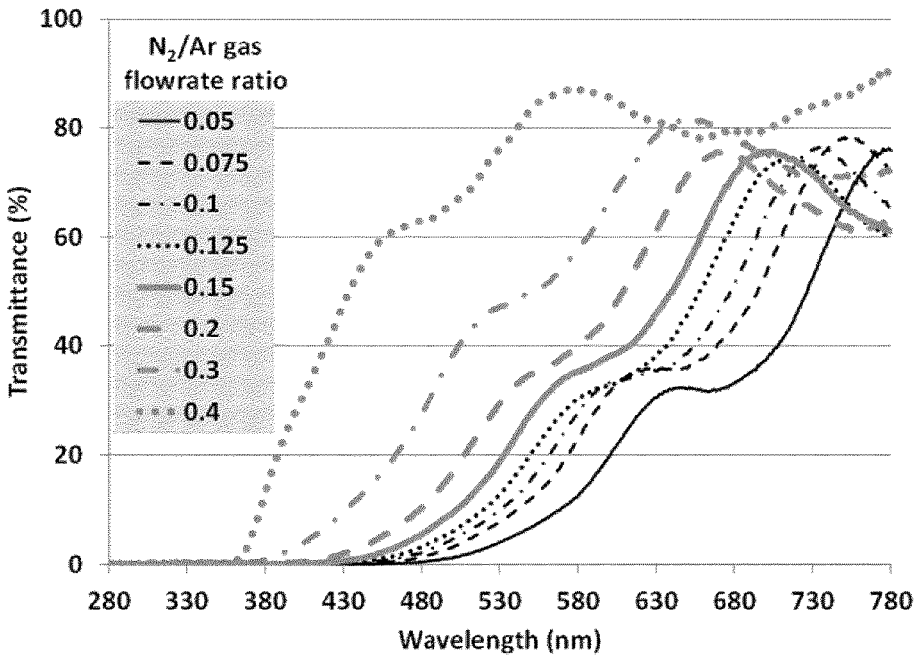
FIG.3

OPTICAL ARTICLE COMPRISING A LIGHT ABSORBING COMPOUND AND A CORRESPONDING MANUFACTURING METHOD

CROSS-REFERENCE TO RELATED APPLICATIONS

This application is a national phase application under 35 U.S.C. § 371 of International Application No. PCT/EP2021/059007 filed 7 Apr. 2021, which claims priority to European Patent Application No. 20315205.3 filed 21 Apr. 2020. The entire contents of each of the above-referenced disclosures is specifically incorporated by reference herein without disclaimer.

FIELD OF THE DISCLOSURE

The present disclosure relates to an optical article comprising a light absorbing compound and to a corresponding manufacturing method.

In particular embodiments, the present disclosure is directed to absorptive multilayer interferential reflective (also referred to as "mirror") or antireflective (hereafter referred to as "AR") coatings for optical articles, such as, by way of non-limiting example, for ophthalmic lenses, with flexibly controllable transmittance between class or category 0 and class 4, making it possible to shift smoothly and adaptively from clear lenses to sunwear, for applications to sunglasses.

BACKGROUND OF THE DISCLOSURE

As shown in FIGS. 1 and 2, a traditional sunglass production flow may start, either from piano lenses incorporated with specific absorption dyes (FIG. 1), or from clear lenses with a prescription (FIG. 2).

For piano lenses, a hard coat is generally added and then an AR coating or mirror coating.

For clear prescription lenses, in the prior art, tinting is an essential step for producing sunglasses.

In other words, the prior art is silent as to how a desired visible light mean transmission factor can be reached for a given lens without any tinting step.

U.S. Pat. No. 7,736,742 B2 discloses a technique for obtaining uniform coloration in an optical article without performing such conventional tinting step, by depositing, through a vacuum evaporation process, visible light absorbing AR stacks comprising sub-stoichiometric titanium oxide layers based on a predetermined mixture of source material.

Nevertheless, such technique does not make it possible to easily control in a flexible manner the resulting transmittance of the colored optical article. This is because in a typical multilayer interferential AR and/or mirror stack, there are at least two high refractive index layers (hereafter referred to as "HI" layers, having typically a refractive index above or equal to 1.5), usually a thinner one and a thicker one, and at least two low refractive index layers (hereafter referred to as "LI" layers, having typically a refractive index below 1.5). Once the composition of the source material mixture for the coating is determined, if both the thinner and the thicker HI layers in the absorptive AR and/or mirror stack are light absorbing layers, it is difficult to adjust the composition and, consequently, the absorbance, of the coating deposited in the vacuum evaporation process.

Namely, the absorbance of the coating may depend on the composition of the source material mixture, e.g. the homogeneity and composition fluctuation upon preparing such source material mixture affects the optical properties and performances of the deposited coating.

Hence, with the above prior art technique, it is difficult to control the overall transmittance of the coating.

Therefore, there is an unfulfilled need to easily control in a flexible manner the transmittance of the AR or mirror coating of an optical article in a wide range of values of visible light mean transmission factors and in various absorptive layer configurations, i.e. where the absorptive layer is the thinner HI layer, or the thicker HI layer, or both, or even a higher number of HI layers.

SUMMARY OF THE DISCLOSURE

An object of the disclosure is to overcome at least some of the above-mentioned limitations of the prior art.

To that end, the disclosure provides an optical article comprising a base material having at least one face coated with an interferential multilayer coating providing either antireflective or high reflective properties, wherein the coating comprises at least one layer of light absorbing material which has an adjustable composition and thickness, such that the visible light mean transmission factor of the coating is controllable to have a value between 95% and 5%.

This may be regarded as a simpler alternative approach for sunglass production.

Namely, the light absorbing material can be directly used on any kind of substrate or base material without requiring tinting that substrate or base material.

Additionally, the transmittance TvD65, meaning the visible light mean spectral transmission factor with standard illuminant D65, of the coated optical article can be flexibly controlled from class 0 to class 4.

The disclosure also provides sunglasses, wherein those sunglasses comprise at least one optical article as succinctly described above.

The disclosure further provides a method for manufacturing an optical article comprising a base material having at least one face coated with an interferential multilayer coating providing either antireflective or high reflective properties, wherein the coating comprises at least one layer of light absorbing material which has an adjustable composition and thickness, such that the visible light mean transmission factor of the coating is controllable to have a value between 95% and 5%, the method comprising depositing on the base material a predetermined thickness of the at least one layer of light absorbing material.

As the sunglasses and the manufacturing method according to the disclosure have the same particular features and advantages as the optical article, they are not detailed here.

BRIEF DESCRIPTION OF THE DRAWINGS

For a more complete understanding of the description provided herein and the advantages thereof, reference is now made to the brief descriptions below, taken in connection with the accompanying drawings and detailed description, wherein like reference numerals represent like parts.

FIG. 1, already described, is a flow diagram of sunglass production flow starting from piano lenses according to the prior art.

FIG. 2, already described, is a flow diagram of sunglass production flow starting from clear lenses according to the prior art.

FIG. 3 is a set of graphs showing typical transmittance spectra of a plurality of lens substrates provided with coatings according to the disclosure, in an embodiment.

DETAILED DESCRIPTION OF THE DISCLOSURE

Figure 4:
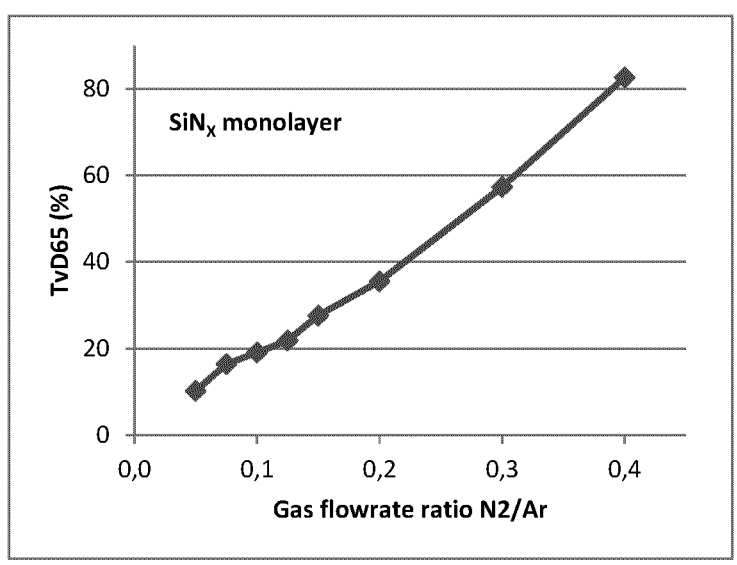
FIG. 4 is a graph showing the calculated value of the mean luminous transmission factor Tv for an absorptive SiN$_x$ monolayer coating according to the disclosure in a particular embodiment, showing the dependence of Tv on the N$_2$/Ar gas flow rate ratio during deposition.

In the description which follows, the drawing figures are not necessarily to scale and certain features may be shown in generalized or schematic form in the interest of clarity and conciseness or for informational purposes. In addition, although making and using various embodiments are discussed in detail below, it should be appreciated that as described herein are provided many inventive concepts that may embodied in a wide variety of contexts. Embodiments discussed herein are merely representative and do not limit the scope of the disclosure. It will also be obvious to one skilled in the art that all the technical features that are defined relative to a process can be transposed, individually or in combination, to a device and conversely, all the technical features relative to a device can be transposed, individually or in combination, to a process and the technical features of the different embodiments may be exchanged or combined with the features of other embodiments.

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises", "has", "contains", or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about".

Also unless otherwise indicated, the indication of an interval of values "from X to Y" or "between X and Y", according to the present disclosure, means including the values of X and Y.

In the present disclosure, when an optical article comprises one or more coatings on its surface, the expression "to deposit a layer or a coating onto the article" is intended to mean that a layer or a coating is deposited onto the external (exposed) surface of the outer coating of the article, that is to say its coating that is the most distant from the substrate.

A coating that is said to be "on" a substrate or deposited "onto" a substrate is defined as a coating which (i) is positioned above the substrate, (ii) is not necessarily in contact with the substrate, that is to say one or more intermediate coatings may be arranged between the substrate and the coating in question, and (iii) does not necessarily completely cover the substrate.

In a particular embodiment, the coating on a substrate or deposited onto a substrate is in direct contact with the substrate.

As used herein, the "rear" (or the "inner") face of the substrate is intended to mean the face which, when using the optical article, is the nearest from the wearer's eye. Such rear or inner face is generally concave. On the contrary, the front face of the substrate is the face which, when using the optical article, is the most distant from the wearer's eye. It is generally convex.

In addition, the "angle of incidence (symbol θ)" is the angle formed by a ray light incident on an ophthalmic lens surface and a normal to the surface at the point of incidence. The ray light is for instance an illuminant light source, such as the standard illuminant D65 as defined in the international colorimetric CIE L*a*b*. Generally the angle of incidence changes from 0° (normal incidence) to 90° (grazing incidence). The usual range for angle of incidence is from 0° to 75°.

The colorimetric coefficients of the optical article of the disclosure in the international colorimetric system CIE L*a*b* are calculated between 380 nm and 780 nm, taking the standard illuminant D65 and the observer into account (angle of 10°). The observer is a "standard observer" as defined in the international colorimetric system CIE L*a*b*.

The expression "natural light" or "visible light" includes any type of natural light, especially daylight or sunlight. Sunlight has a bright emission in the whole visible spectrum, especially in the 550 nm-620 nm wavelength range. In some embodiments, the expression "natural light" or "visible light" also includes artificial light having a large spectrum, such as light emitted by some LED devices that mimic the sun.

In the present invention, the terms "absorbing" and "absorption" of a device in a wavelength range refer to a case where the mean emission value of the device in the wavelength range is lower than 50% of the mean emission value of the device in each of the adjacent 40 nm wavelength ranges.

Generally speaking, the interferential coatings of the optical article according to the disclosure, which will be referred to as "the antireflective coating" or "the reflective (or mirror) coating", depending on the configuration described, may be deposited onto any substrate, and preferably onto organic lens substrates, for example a thermoplastic or thermosetting plastic material. Thermoplastic may be selected from, for instance: polyamides; polyimide; polysulfones; polycarbonates and copolymers thereof; poly(ethylene terephthalate) and polymethylmethacrylate (PMMA).

Thermoset materials may be selected from, for instance: cycloolefin copolymers such as ethylene/norbornene or ethylene/cyclopentadiene copolymers; homo- and copolymers of allyl carbonates of linear or branched aliphatic or aromatic polyols, such as homopolymers of diethylene glycol bis(allyl carbonate) (CR 39®); homo- and copolymers of (meth)acrylic acid and esters thereof, which may be derived from bisphenol A; polymer and copolymer of thio(meth) acrylic acid and esters thereof, polymer and copolymer of allyl esters which may be derived from bisphenol A or phtalic acids and allyl aromatics such as styrene, polymer and copolymer of urethane and thiourethane, polymer and copolymer of epoxy, and polymer and copolymer of sulphide, disulfide and episulfide, and combinations thereof.

As used herein, a (co)polymer is intended to mean a copolymer or a polymer. As used herein, a (meth)acrylate is intended to mean an acrylate or a methacrylate. As used herein, a polycarbonate (PC) is intended to mean either homopolycarbonates or copolycarbonates and block copolycarbonates.

Homopolymers of diethylene glycol bis(allyl carbonate) (CR39®), allylic and (meth)acrylic copolymers, having a refractive index between 1.54 and 1.58, polymer and copolymer of thiourethane, polycarbonates are preferred.

The substrate may be coated with one or more functional coatings prior to depositing the antireflective or mirror coating of the disclosure. These functional coatings traditionally used in optics may be, without limitation, an impact-resistant primer layer, an abrasion-resistant coating and/or a scratch-resistant coating, a polarizing coating, a photochromic coating or a tinted coating. In the following, a substrate means either a bare substrate or such a coated substrate.

Prior to depositing the antireflective or mirror coating, the surface of said substrate is usually submitted to a physical or chemical surface activating treatment, so as to reinforce the adhesion of the antireflective or mirror coating. Such pretreatment is generally conducted under vacuum. It may be a bombardment with energetic and/or reactive species, for example with an ion beam ("Ion Pre-Cleaning" or "IPC") or with an electron beam, a corona discharge treatment, an ion spallation treatment, an ultraviolet treatment or a plasma-mediated treatment under vacuum, generally using an oxygen or an argon plasma. It may also be an acid or basic treatment and/or a solvent-based treatment (water, hydrogen peroxide or any organic solvent).

An optical article according to the disclosure comprises at least one ophthalmic lens or optical filter or optical glass or optical material suitable for human vision, e.g. at least one ophthalmic lens, or optical filter, or optical film or patch intended to be fixed on a substrate, or optical glass, or optical material intended for use in an ophthalmic instrument, for example for determining the visual acuity and/or the refraction of a subject, or any kind of safety device including a safety glass or safety wall intended to face an individual's eye, such as a protective device, for instance safety lenses or a mask or shield.

The optical article may be implemented as eyewear equipment having a frame that surrounds at least partially one or more ophthalmic lenses. By way of non-limiting example, the optical article may be a pair of glasses, sunglasses, safety goggles, sports goggles, a contact lens, an intraocular implant, an active lens with an amplitude modulation such as a polarized lens, or with a phase modulation such as an auto-focus lens, etc.

The at least one ophthalmic lens or optical glass or optical material suitable for human vision can provide an optical function to the user i.e. the wearer of the lens.

It can for instance be a corrective lens, namely, a power lens of the spherical, cylindrical and/or addition type for an ametropic user, for treating myopia, hypermetropia, astigmatism and/or presbyopia. The lens can have a constant power, so that it provides power as a single vision lens would do, or it can be a progressive lens having variable power.

The optical article according to the disclosure comprises a base material having at least one face, i.e. a surface on one side, coated with an interferential multilayer coating providing either antireflective or high reflective properties.

The base material may also have an opposite face coated, i.e. a surface on the other side, also coated, so that, in such a case, two faces of the optical article opposite to one another may be coated.

The base material may have a visible light mean transmission factor above 95%.

Typically, if the mean light reflection factor Rv of a coating is lower than 2.5%, or preferably lower than 1.5%, or more preferably lower than 1%, then the coating is referred to as an antireflective ("AR") coating.

Otherwise, if the mean light reflection factor Rv of a coating is higher than 2.5%, the coating is referred to as a high reflective coating or "mirror" coating.

The mean light reflection factor Rv may be defined by the following $$R_V = \frac{\int_{380}^{780} R(\lambda) \cdot V(\lambda) \cdot D_{65}(\lambda) \cdot d\lambda}{\int_{380}^{780} V(\lambda) \cdot D_{65}(\lambda) \cdot d\lambda}$$

where $R(\lambda)$ is the reflectance at a wavelength A, $V(\lambda)$ is the eye sensitivity function in the color space defined by the CIE (Commission on Illumination, in French "Commission Internationale de l'Eclairage") in 1931 and $D_{65}(\lambda)$ is the daylight illuminant defined in the CIE S005/E-1998 standard.

The coating according to the present disclosure may have antireflective properties or high reflective (mirror) properties. In any case, the coating according to the invention comprises, preferably consists of, a multilayer interferential coating comprising low refractive index (LI) layers, and at least one light absorbing layer, also referred to as an "absorbent layer", including one or more light absorbing compounds, such that the visible light means transmission factor of the coating is between 95% and 5%.

The interferential coating according to the invention can be associated either by coating or by lamination, to a clear substrate i.e. a substrate having a visible light mean transmission factor inferior to 5%, and define with the latter an optical article having a visible light mean transmission factor between 95% and 5%.

As such, the interferential coating according to the invention can be tailored so as to define, with the associated clear substrate, different tints of sunglasses with different visible light mean transmission factors:

between 80 and 95% between 43 and 80% (known as sunglasses of the category or class 1)

between 18 and 43% (known as sunglasses of the class 2)

between 8 and 18% (known as sunglasses of the class 3)

between 5 and 8% (known as sunglasses of the class 4).

The absorbent layer may be any layer known to one skilled in the art and suitable for absorbing at least part of the visible light. Preferably, the extinction coefficient of the absorbent layer is above or equal to 0.1, or more preferably above or equal to 0.3, or even more preferably above or equal to 0.5.

In an embodiment, the coating comprises at least one layer having a refractive index below 1.55 and the extinction coefficient of the at least one layer of light absorbing material is above or equal to 0.1.

In an embodiment, the at least one layer of light absorbing material comprises a sub-stoichiometric inorganic material having a refractive index above or equal to 1.55.

In an embodiment, the sub-stoichiometric inorganic material may be $SiN_x$, where x is a predetermined number lower than 1, or may be $SiO_x$, where x is a predetermined number lower than 2.

The interferential stack may comprise at least one, or at least two, or at least three, absorbent layers.

The absorbent layer of the interferential stack may be a high index (HI) layer with a refractive index above or equal to 1.5, for example of at least 1.55, preferably at least 1.60, in particular at least 1.65.

The at least one layer of light absorbing material may comprise a material selected from a group consisting of nickel oxide, silicon oxide, tungsten oxide and titanium oxide.

HI layers may comprise, without limitation, one or more mineral oxides such as SiN, $TiO_2$, $PrTiO_3$, $LaTiO_3$, $ZrO_2$, $Ta_2O_5$, $Y_2O_3$, $Ce_2O_3$, $La_2O_3$, $Dy_2O_5$, $Nd_2O_5$, $HfO_2$, $Sc_2O_3$, $Pr_2O_3$, $Al_2O_3$, or $Si_3N_4$, as well as sub-stoichiometric compounds thereof, such as sub-stoichiometric $SiN_x$ where x is a predetermined number and x<1, or $TiO_x$ with $1 \leq x < 2$, and sub-stoichiometric $SiO_x$ (with x<2), and mixtures thereof.

The sub-stoichiometric HI materials listed above can show absorbing properties depending on the thickness and conditions used during their deposition on the substrate to which they are associated.

The material of the absorbent layer can be any material known in the art and affording the desired light absorption properties. For instance, the material of the absorbent layer may be, in addition to the HI materials listed above, selected from the group consisting of NiO, SiO, WO, TiO, and any mixture thereof, in particular the material of the absorbent layer is NiO.

The deposition of such absorbent layer may be performed by any suitable technique known in the art. For instance, it may be performed by a method selected from the group consisting of vacuum deposition, vapor deposition, sol-gel deposition, spin coating, dip coating, spray coating, flow coating, film laminating, sticker coating, roller coating, brush coating, painting, sputtering, casting, Langmuir-Blodgett deposition, laser printing, inkjet printing, screen printing, pad printing, and any combination thereof.

The thickness of each absorbent layer may vary to a large extent, depending for instance on the desired properties for the layer, the layer material, the deposition technique and/or the layer position in the stack. For instance, the thickness of an absorbent layer may be comprised between 20 nm and 310 nm, preferably between 20 nm and 200 nm.

The LI layer may be any low index layer known to one skilled in the art. The refractive index of the LI layer is preferably below 1.55, more preferably below 1.50.

Among the materials suitable for the LI layer can be cited for instance, without limitation, $SiO_2$, $SiO_x$ with $1 \leq x < 2$, $MgF_2$, $ZrF_4$, $Al_2O_3$, $AlF_3$, chiolite ($Na_3Al_3F_{14}$), cryolite ($Na_3[AlF_6]$), or any mixture thereof, preferably $SiO_2$ or $SiO_2$ doped with $Al_2O_3$ which contributes to raising the critical temperature of the stack. When $SiO_2/Al_2O_3$ mixtures are used, the LI layer preferably contains from 1 to 10%, more preferably from 1 to 8% by weight of $Al_2O_3$ relative to the total weight of $SiO_2+Al_2O_3$ in said layer. A too high amount of alumina is detrimental to adhesion of the AR coating. In a preferred embodiment, the LI layer is a $SiO_2$-based layer. The anti-reflective stack may comprise more than one LI layer, which can be made of the same or of different materials.

The thickness of each LI layer may vary to a large extent, depending for instance on the desired properties for the layer, on the layer material, on the deposition technique and/or on the layer position in the stack. For instance, the thickness of a LI layer may be comprised between 10 nm and 200 nm, preferably between 20 nm and 200 nm.

To confer to the interferential coating according to the invention either mirror or anti-reflective properties, the materials, thicknesses and number of HI and LI layers can be flexibly designed.

When the interferential coating is of the antireflective kind, it can be any antireflective stack appropriate for reducing/avoiding reflecting at least part of natural light, especially sunlight.

When the interferential coating is of the high reflective kind (mirror), it can be any reflective stack appropriate for allowing/encouraging/enhancing reflecting at least part of natural light, especially sunlight.

The interferential stack coating can be designed by a traditional modeling process of optical coatings comprising modeling the successive layers based on the well-known matrix method.

The matrix method is well-known in the art and a description of steps thereof is provided for instance by Larouche et al. in Applied Optics, 2008, 47, 13, C219-C230.

The interferential coating may be coated directly onto the base material or substrate. Alternatively, at least one layer may be present between the base material and the anti-reflective coating, such as a hard coat layer.

According to the disclosure, the at least one layer of light absorbing material has an adjustable composition and thickness, such that the visible light mean transmission factor of the coating is controllable to have a value between 95% and 5%.

In an embodiment where the coating comprises, as a HI absorbing layer, a sub-stoichiometric HI layer, the sub-stoichiometry of the material is obtained thanks to physical vapor deposition or chemical vapor deposition of the material, and more preferably by magnetron sputtering.

For example, in an embodiment where the coating is made of $SiN_x$, a predetermined thickness of the $SiN_x$ layer may be deposited by magnetron sputtering of a silicon target in an atmosphere comprising a mixture of $N_2$ and Ar with a predetermined $N_2$/Ar ratio.

In such an embodiment, the value of the visible light mean transmission factor of the coating depends on the value of the thickness of the $SiN_x$ layer and on the value of the $N_2/Ar$ ratio.

In an embodiment where the coating comprises, as a HI absorbing layer, a layer made of $SiO_x$, a predetermined thickness of the $SiO_x$ layer may be deposited by magnetron sputtering of a silicon target in an atmosphere comprising a mixture of $O_2$ and Ar with a predetermined $O_2/Ar$ ratio.

In such an embodiment, the value of the visible light mean transmission factor of the coating depends on the value of the thickness of the $SiO_x$ layer and on the value of the $O_2/Ar$ ratio.

The above-mentioned silicon target is a non-limiting example of a source material for depositing the $SiN_x$ and/or $SiO_x$ light absorbing materials.

Figure 12:
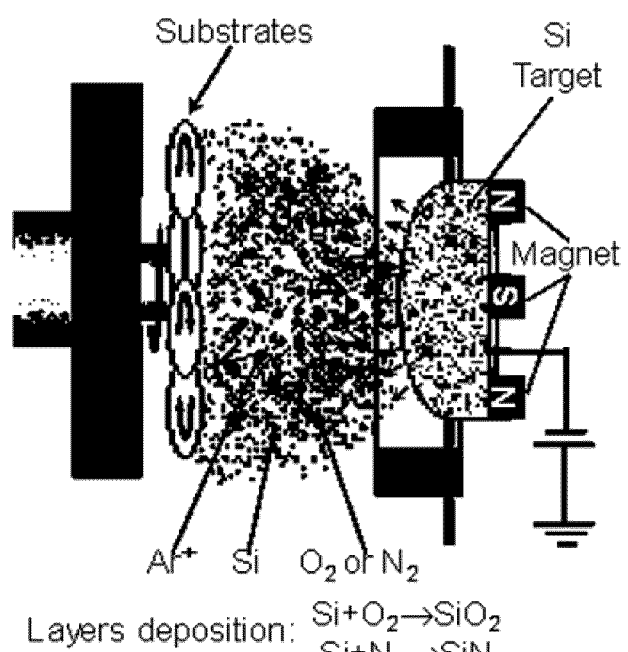
FIG. 12 is a schematic view illustrating a thin film deposition process involved in the present disclosure, in a particular embodiment.

In a thin film deposition process by magnetron sputtering, the source material may be a solid block and is referred to as a sputtering target. By way of non-limiting example, the sputtering target may be a pure silicon disk, as shown in FIG. 12.

In an embodiment, during the deposition process, high energy argon plasma is generated and bombards the Si target surface. As a result, Si atoms or clusters are kicked out by the high energy $Ar^+$ ions from the Si target and are then deposited onto the substrate surface to form a layer or thin film.

During the sputtering process, if nitrogen or oxygen gas is introduced into the deposition chamber, silicon nitride or silicon oxide material will be deposited.

If a sufficient amount of nitrogen or oxygen is introduced, optically transparent SiN or $SiO_2$ materials with a stoichiometric composition can be deposited.

According to the present disclosure, on the other hand, as long as an insufficient amount of nitrogen or oxygen is introduced, optically absorptive $SiN_x$ (with x<1) or $SiO_x$ (with x<2) materials with a sub-stoichiometric composition can be deposited.

According to the disclosure, the coating comprises more than one layer i.e. it is a multilayer coating.

In some embodiments, the coating may comprise at least one sub-stoichiometric $SiN_x$ and/or $SiO_x$ layer, where x is a predetermined number.

In such a case, predetermined thicknesses of the $SiN_x$ and SiN layers may be deposited by magnetron sputtering of a silicon target in an atmosphere comprising a mixture of $N_2$ and Ar with a predetermined $N_2/Ar$ ratio. Similarly, predetermined thicknesses of the $SiO_x$ and $SiO_2$ layers may be deposited by magnetron sputtering of a silicon target in an atmosphere comprising a mixture of $O_2$ and Ar with a predetermined $O_2/Ar$ ratio.

The transmittance of a lens coated with one or more such absorptive layers can be controlled by selecting its composition and/or its thickness. As a result, class 0 to 4 transmission can be achieved for the resulting coated lens.

Namely, the value of the visible light mean transmission factor of the coating depends on:
    the thicknesses of the $SiN_x$ and SiN layers;
    the thicknesses of the $SiO_x$ and $SiO_2$ layers; and
    the values of the $N_2/Ar$ and $O_2/Ar$ ratios.

In an embodiment, the coating according to the disclosure may be a colored mirror coating, i.e. the mirror coating has a predetermined color.

The color of the mirror can be designed in a very flexible manner, so that it may show at least one predetermined color, said color having wavelengths in the visible wavelength range, including blue and/or green and/or gold and/or purple and/or pink and/or red and/or any other desired color or mixture of colors.

Sunglasses according to the disclosure may be provided with one more (generally two) lenses having features of the optical articles as described above.

The present disclosure also provides a method for manufacturing an optical article as described above.

In some embodiments where the optical article comprises a base material having at least one face coated with an interferential multilayer coating providing either antireflective or high reflective properties, wherein the coating comprises at least one layer of light absorbing material which has an adjustable composition and thickness, such that the visible light mean transmission factor of said coating is controllable to have a value between 95% and 5%, the method for manufacturing the optical article comprises depositing on the base material a predetermined thickness of the at least one layer of light absorbing material.

In some embodiments, the depositing step may comprise depositing a predetermined thickness of $SiN_x$ in an atmosphere comprising a mixture of $N_2$ and Ar with a predetermined $N_2/Ar$ ratio.

In such embodiments, the value of the visible light mean transmission factor of the coating depends on:
    the value of the thickness of the deposited $SiN_x$; and
    the value of the $N_2/Ar$ ratio.

In alternative embodiments, the depositing step may comprise depositing a predetermined thickness of $SiO_x$ in an atmosphere comprising a mixture of $O_2$ and Ar with a predetermined $O_2/Ar$ ratio.

In such alternative embodiments, the value of the visible light mean transmission factor of the coating depends on:
    the value of the thickness of the deposited $SiO_x$; and
    the value of the $O_2/Ar$ ratio.

FIG. 3 shows typical transmittance spectra of eight lens substrates provided with coatings in accordance with the present disclosure.

One surface, e.g. the convex surface, denoted Cx, of the lenses was coated with monolayer $SiN_x$ coatings having a thickness of approximately 260 nm, which were deposited by magnetron sputtering in a $N_2+Ar$ mixture atmosphere, with different ratios of $N_2/Ar$ gas flow rate.

It can be seen that, as the $N_2/Ar$ ratio decreases, the transmittance of the coated lenses decreases significantly. The mean luminous transmission factor Tv (%) can be calculated according to the following formula:

$$Tv = \frac{\int_{380}^{780} T(\lambda) \cdot V(\lambda) \cdot D_{65}(\lambda) d\lambda}{\int_{380}^{780} V(\lambda) \cdot D_{65}(\lambda) d\lambda}$$

where $T(\lambda)$ is the spectral transmittance of the lenses as shown in FIG. 3, $V(\lambda)$ is the human eye sensitivity function, and $D_{65}(\lambda)$ is the solar spectrum.

The calculated value of Tv for the above-mentioned absorptive $SiN_x$ monolayer is shown in FIG. 4. It can be seen that Tv is approximately proportional to the ratio of $N_2/Ar$ gas flow rate during coating deposition.

In addition to their dependence on coating composition, the transmittance of the $SiN_x$ coatings also depends on coating thickness.

Figure 5:
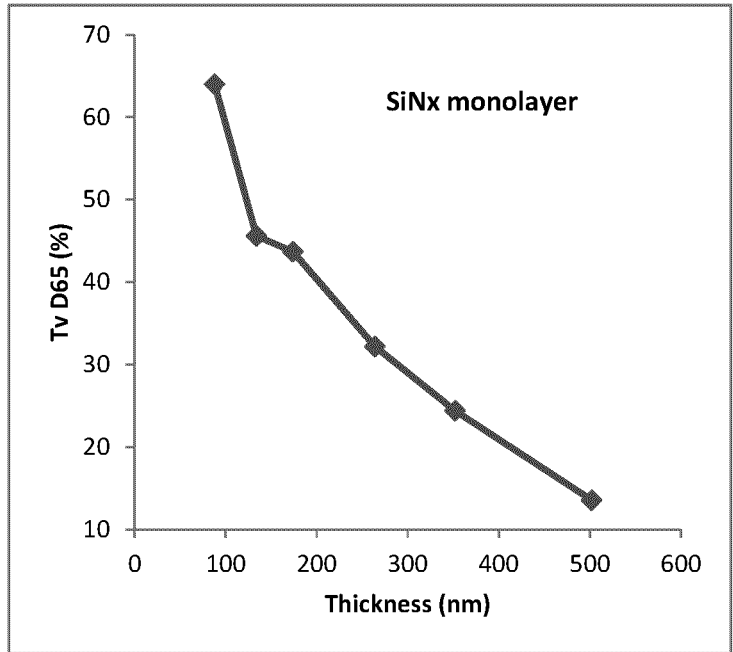
FIG. 5 is a graph showing the variation of Tv for the same SiN$_x$ monolayer coating as in FIG. 4, as a function of the thickness of such coating, showing the dependence of Tv on the thickness of the coating.

In this respect, FIG. 5 shows the variation of mean visible transmission factor Tv as a function of the thickness of the SiN$_x$ coatings deposited by magnetron sputtering, with a ratio of N$_2$/Ar gas flow rate fixed at 0.2.

It can be seen that Tv decreases as the coating thickness increases.

Similarly, sub-stoichiometric SiO$_x$ (x<2) coatings deposited by reactive magnetron sputtering show optical absorption.

Figure 6:
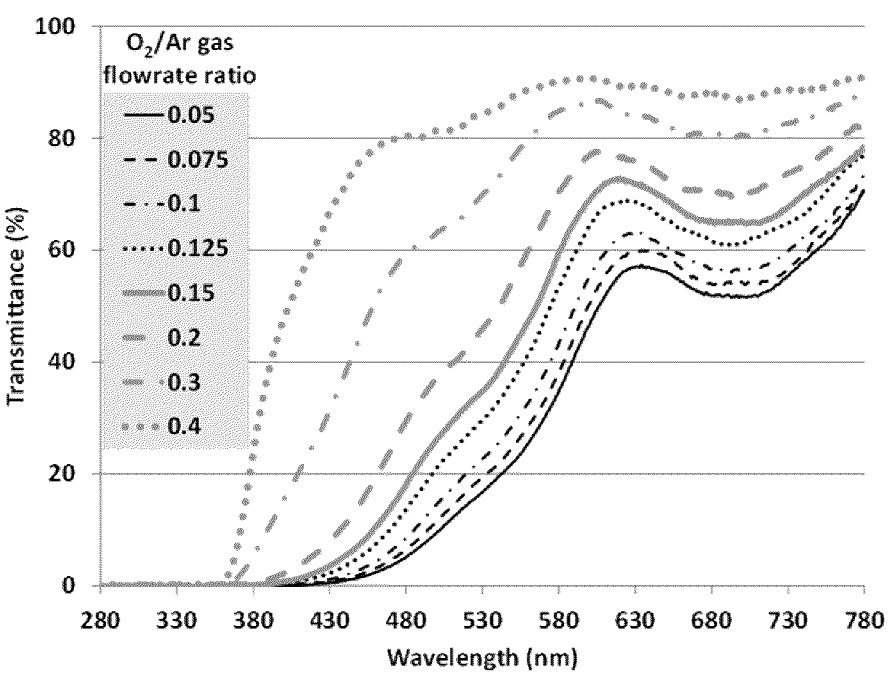
FIG. 6 is a set of graphs showing typical transmittance spectra of a plurality of lens substrates provided with coatings according to the disclosure, in an embodiment.

In this respect, FIG. 6 shows typical transmittance spectra of eight lenses, of which the front surface was coated with monolayer SiO$_x$ coatings having an approximate thickness of 370 nm, which were deposited in a O$_2$+Ar mixture atmosphere with different ratios of O$_2$/Ar gas flow rate.

It can be seen that, as the O$_2$/Ar ratio decreases, the transmittance of the lenses decreases significantly, particularly in the short wavelength range.

Figure 7:
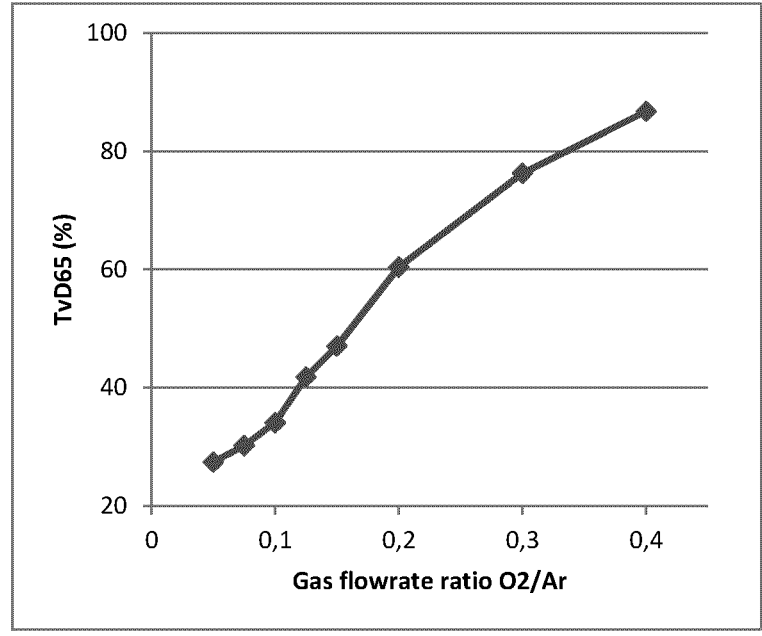
FIG. 7 is a graph showing the calculated value of Tv for a SiO$_x$ monolayer coating according to the disclosure in a particular embodiment, showing the dependence of Tv on the O$_2$/Ar gas flow rate ratio during deposition.

FIG. 7 shows that Tv for the SiO$_x$ monolayer coatings decreases as the ratio of O$_2$/Ar gas flow rate decreases, thus showing the dependence of Tv of SiO$_x$ monolayer coatings on the ratio of O$_2$/Ar gas flow rate during deposition.

Figure 8:
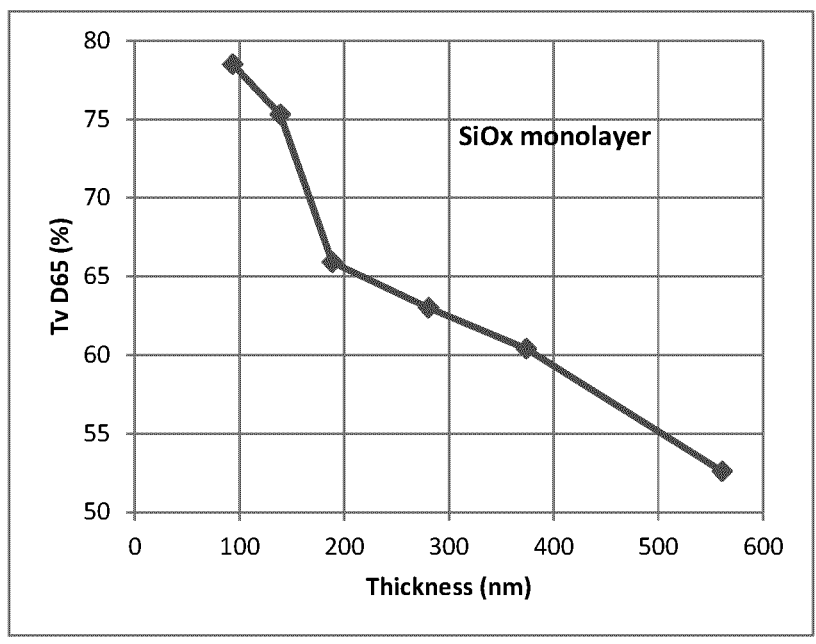
FIG. 8 is a graph showing the variation of Tv for the same SiO$_x$ monolayer coating as in FIG. 7, as a function of the thickness of such coating, showing the dependence of Tv on the thickness of the coating.

FIG. 8 shows the variation of Tv as a function of the thickness of the SiO$_x$ coatings deposited by magnetron sputtering, with a ratio of O$_2$/Ar gas flow rate fixed at 0.2.

It can be seen that Tv decreases as the coating thickness increases.

The depositing step in all the above methods may comprise magnetron sputtering using a silicon target.

Nevertheless, magnetron sputtering is mentioned by way of non-limiting example only. As a variant, an e-beam evaporation technique may be used for generating an antireflective coating according to the disclosure.

In such a variant, an additional gas line for supplying N$_2$ and/or O$_2$ may be provided in the e-beam evaporation antireflective coating machine.

More generally, the depositing step may comprise using a chemical or physical vapor deposition technique.

Absorptive materials can be incorporated in multilayer interferential AR or mirror coatings as detailed above. Such absorptive interferential coatings are applicable to sunglasses, with a simpler production flow as in the prior art.

Figure 9:
FIG. 9 is a flow diagram of sunglass production flow according to the present disclosure, in a particular embodiment, starting from prescription lenses.

Namely, as shown in the flow diagram of self-explanatory FIG. 9, no tinting step is needed.

In order to design AR or mirror stacks involving absorptive SiO$_x$ and/or SiN$_x$ materials, optical properties of different monolayer coatings deposited by magnetron sputtering can be determined by spectroscopy ellipsometry.

Stoichiometric SiN (deposited in a N$_2$+Ar mixture atmosphere, with a ratio of N$_2$/Ar gas flow rate higher than 1.0) and SiO$_2$ (deposited in an O$_2$+Ar mixture atmosphere, with a ratio of O$_2$/Ar gas flow rate higher than 1.25) coatings showed no obvious absorption in the visible light region (380-780 nm). Their refractive index at 550 nm is 1.968 and 1.462, respectively.

Figure 10:
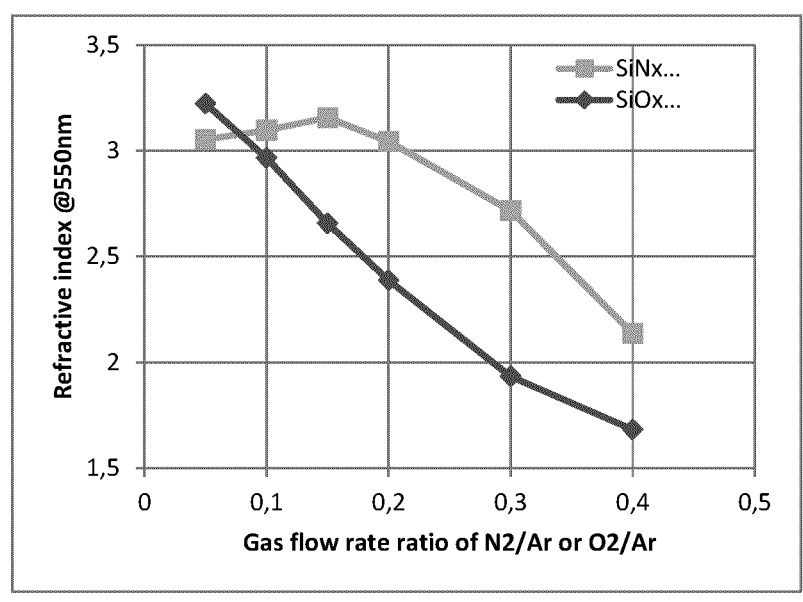
FIG. 10 is a set of two graphs showing the refractive index at 550 nm of light absorptive SiN$_x$ and SiO$_x$ coatings deposited by magnetron sputtering according to the present disclosure, in a particular embodiment.

FIG. 10 shows the refractive index at 550 nm of the absorptive SiN$_x$ and SiO$_x$ coatings deposited by magnetron sputtering.

It is noted that the refractive index of sub-stoichiometric SiN$_x$ and SiO$_x$ coatings is higher than that of corresponding stoichiometric SiN and SiO$_2$ coatings. Generally, the refractive index increases when decreasing the ratio of N$_2$/Ar or O$_2$/Ar gas flow rate. In other words, the refractive index increases gradually when the coating becomes more and more deficient in nitrogen or in oxygen.

Such absorptive materials can be incorporated in multilayer interferential AR or mirror coatings in combination with stoichiometric SiO$_2$ and/or SiN materials.

Table 1 below shows sixteen examples of AR and/or mirror stacks consisting of SiN, SiO$_2$, and absorptive SiO$_x$ or SiN$_x$ layers.

The reflection color of those AR/mirror coatings can be flexibly designed in different visible color domains, such as blue, green, gold, etc.

TABLE 1

| Example 1 - Blue Mirror #1 | | Example 2 - Blue Mirror #2 | | Example 3 - Blue Mirror #3 | | Example 4 - Blue Mirror #4 | |
|---|---|---|---|---|---|---|---|
| SiO$_2$ | 140.9 nm | SiO$_2$ | 188.5 nm | SiO$_2$ | 194.9 nm | SiO$_2$ | 194.9 nm |
| SiOx (0.2) | 17.6 nm | SiOx (0.2) | 20.0 nm | SiOx (0.2) | 20.0 nm | SiOx (0.2) | 20.0 nm |
| SiO$_2$ | 120.6 nm | SiO$_2$ | 157.4 nm | SiO$_2$ | 155.9 nm | SiO$_2$ | 155.9 nm |
| SiN | 80.6 nm | SiN | 60.9 nm | SiN | 58.2 nm | SiN | 58.2 nm |
| HC1.5 | | SiNx (0.2) | 260 nm | SiNx (0.1) | 260 nm | SiNx (0.05) | 260 nm |
| | | HC1.5 | | HC1.5 | | HC1.5 | |
| Rv(%) | 12 | Rv(%) | 12 | Rv(%) | 12 | Rv(%) | 12 |
| h* | 260 | h* | 260 | h* | 260 | h* | 260 |
| C* | 28 | C* | 28 | C* | 28 | C* | 28 |

| Example 5 - Gold Mirror #1 | | Example 6 - Gold Mirror #2 | | Example 7 - Gold Mirror #3 | | Example 8 - Gold Mirror #4 | |
|---|---|---|---|---|---|---|---|
| SiO$_2$ | 99.3 nm | SiO$_2$ | 113.5 nm | SiO$_2$ | 100.5 nm | SiO$_2$ | 100.8 nm |
| SiOx (0.2) | 9.76 nm | SiOx (0.2) | 10.0 nm | SiOx (0.2) | 10.0 nm | SiOx (0.2) | 10.0 nm |
| SiO$_2$ | 141.5 nm | SiO$_2$ | 147.0 nm | SiO$_2$ | 167.2 nm | SiO$_2$ | 165.7 nm |
| SiN | 73.2 nm | SiN | 143.0 nm | SiN | 136.1 nm | SiN | 135.7 nm |
| HC1.5 | | SiNx (0.2) | 260 nm | SiNx (0.1) | 260 nm | SiNx (0.05) | 260 nm |
| | | HC1.5 | | HC1.5 | | HC1.5 | |
| Rv(%) | 11.9 | Rv(%) | 12 | Rv(%) | 12 | Rv(%) | 12 |
| h* | 46 | h* | 45 | h* | 45 | h* | 45 |
| C* | 26 | C* | 28 | C* | 28 | C* | 28 |

| Example 9 - Green Mirror #1 | | Example 10 - Green Mirror #2 | | Example 11 - Green Mirror #3 | | Example 12 - Green Mirror #4 | |
|---|---|---|---|---|---|---|---|
| SiO$_2$ | 102.3 nm | SiO$_2$ | 185.5 nm | SiO$_2$ | 182.1 nm | SiO$_2$ | 183.8 nm |
| SiOx (0.2) | 9.85 nm | SiOx (0.2) | 10.0 nm | SiOx (0.2) | 10.0 nm | SiOx (0.2) | 10.0 nm |
| SiO$_2$ | 47.0 nm | SiO$_2$ | 65.5 nm | SiO$_2$ | 75.1 nm | SiO$_2$ | 74.3 nm |
| SiN | 74.1 nm | SiN | 67..5 nm | SiN | 64.8 nm | SiN | 64.6 nm |
| HC1.5 | | SiNx (0.2) | 260 nm | SiNx (0.1) | 260 nm | SiNx (0.05) | 260 nm |
| | | HC1.5 | | HC1.5 | | HC1.5 | |
| Rv(%) | 8.89 | Rv(%) | 9 | Rv(%) | 9 | Rv(%) | 9 |

TABLE 1-continued

| h* | 134.5 | h* | 135 | h* | 135 | h* | 135 |
| C* | 23 | C* | 25 | C* | 25 | C* | 25 |

| Example 13 Blue Mirror | | Example 14 Blue AR | | Example 15 Gold AR | | Example 16 Green AR | |
|---|---|---|---|---|---|---|---|
| SiOx (0.2) | 13.2 nm | SiO$_2$ | 63.9 nm | SiO$_2$ | 81.2 nm | SiO$_2$ | 74.5 nm |
| SiO$_2$ | 49.4 nm | SiOx (0.2) | 10.6 nm | SiOx (0.2) | 37.2 nm | SiOx (0.2) | 24.7 nm |
| SiOx (0.2) | 87.8 nm | SiO$_2$ | 25.3 nm | SiO$_2$ | 4.8 nm | SiO$_2$ | 16.7 nm |
| SiO$_2$ | 41.2 nm | SiOx (0.2) | 65.3 nm | SiOx (0.2) | 54.4 nm | SiOx (0.2) | 48.0 nm |
| SiN | 20.6 nm | SiO$_2$ | 9.6 nm | SiO$_2$ | 48.3 nm | SiO$_2$ | 18.8 nm |
| HC1.5 | | SiN | 55.2 nm | SiN | 5.1 nm | SiN | 43.9 nm |
| | | HC1.5 | | HC1.5 | | HC1.5 | |
| Rv(%) | 2.44 | Rv(%) | 0.77 | Rv(%) | 0.76 | Rv(%) | 0.7 |
| h* | 260 | h* | 260 | h* | 45 | h* | 135 |
| C* | 28 | C* | 16 | C* | 10 | C* | 9 |

The thickness of each layer of the examples of AR/Mirror stacks is listed in the second column of the corresponding stacks.

For all the examples of AR/Mirror stacks listed in Table 1, the stoichiometric SiO$_2$ is a low index material, while the stoichiometric SiN, and sub-stoichiometric SiO$_x$ and SiN$_x$ are high index materials.

In the present disclosure, LI materials can be defined as materials having a refractive index at a wavelength of 550 nm below 1.60, sometimes below 1.55, and HI materials can be defined as materials having a refractive index at 550 nm above 1.6, sometimes above 1.65.

The stoichiometric SiO$_2$, which has a refractive index of 1.462 at 550 nm, is an LI material. The stoichiometric SiN, which has a refractive index of 1.915 at 550 nm, is a HI material. Referring to FIG. 10, all the sub-stoichiometric materials in the examples of stacks in Table 1, which have a refractive index above 2.0 at 550 nm, are HI materials.

In Table 1, SiO$_x$ (0.2), SiN$_x$ (0.2), SiN$_x$ (0.1) and SiN$_x$ (0.05) refer to light absorptive SiO$_x$ or SiN$_x$ layers deposited with a gas flowrate ratio of O$_2$/Ar equal to 0.2 or N$_2$/Ar equal to 0.2, 0.1 and 0.05, respectively.

The transmittance of prepared prototypes was measured by a Cary60 optical spectrometer.

As described above, the transmittance can be controlled, from class 0 to class 4, by the thickness and/or composition of the light absorptive layers.

Figure 11:
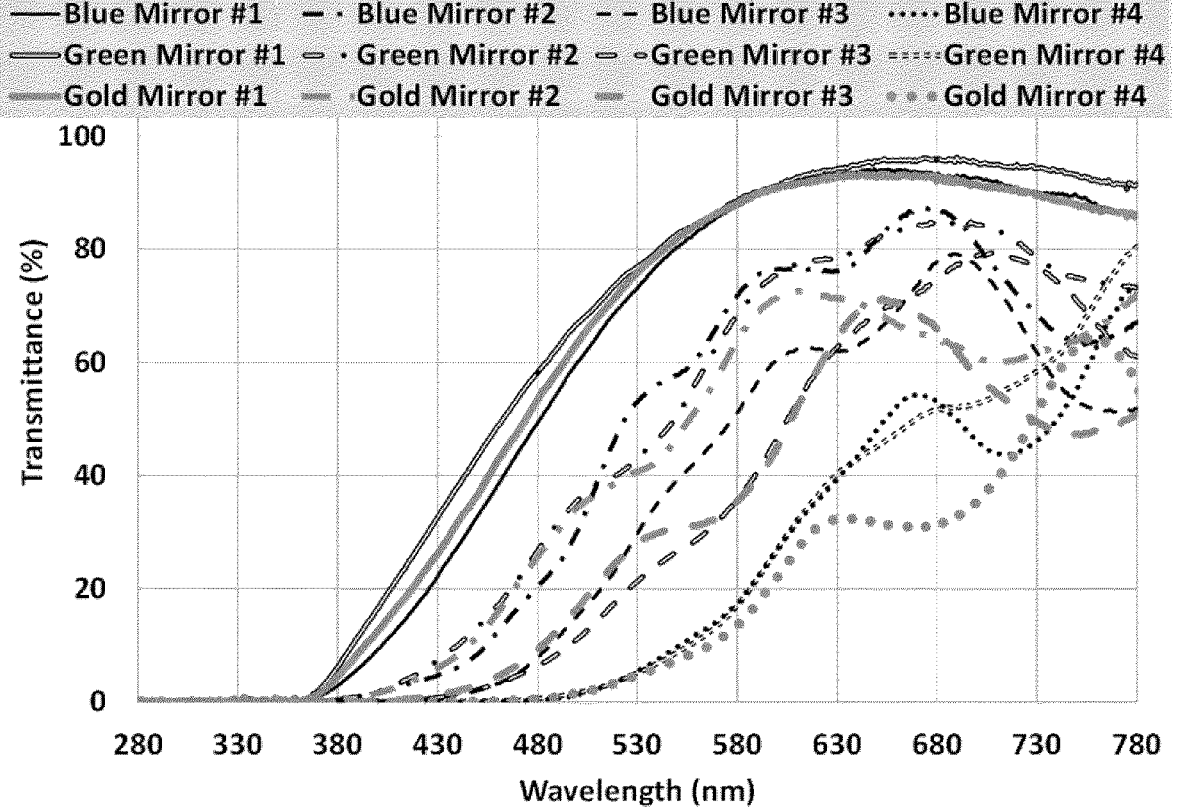
FIG. 11 is a set of graphs showing the transmittance spectra of twelve prototypes of colored lenses in accordance with the present disclosure.

FIG. 11 shows the transmittance spectra of such non-limiting examples of prototypes, coated with blue, green and/or gold absorptive mirror coatings.

The respective values of the visible light transmittance of those example prototypes are listed in Table 2 below.

TABLE 2

| | Blue mirrors | | | | Green mirrors | | | | Gold mirrors | | | |
|---|---|---|---|---|---|---|---|---|---|---|---|---|
| Prototypes | #1 | #2 | #3 | #4 | #1 | #2 | #3 | #4 | #1 | #2 | #3 | #4 |
| Tv D65 (%) | 79.1 | 61.2 | 42.1 | 13.9 | 81.7 | 56.9 | 30.8 | 13.4 | 80.5 | 52.9 | 33.3 | 11.1 |

Although representative optical articles, sunglasses and manufacturing methods have been described in detail herein, those skilled in the art will recognize that various substitutions and modifications may be made without departing from the scope of what is described and defined by the appended claims.

The invention claimed is:

1. An optical article comprising a base material having at least one face coated with an interferential multilayer coating providing either antireflective or high reflective properties, wherein said coating comprises at least one layer of light absorbing material which has an adjustable composition and thickness, such that the visible light mean transmission factor of said coating is controllable to have a value between 95% and 5%;

wherein the adjustable composition comprises SiN$_x$, where x is adjustable and is less than or equal to 1; or wherein the adjustable composition comprises SiO$_x$, where x is adjustable and is less than or equal to 2; and wherein the adjustable composition of the at least one layer of light absorbing material is deposited from a material comprising N$_2$ and Ar or O$_2$ and Ar, wherein an adjustable N$_2$/Ar ratio or O$_2$/Ar ratio is correlated with the controllable visible light mean transmission factor.

2. The optical article according to claim 1, wherein said coating further comprises at least one layer having a refractive index below 1.55 and wherein the extinction coefficient of said at least one layer of light absorbing material is above or equal to 0.1.

3. The optical article according to claim 1, wherein said at least one layer of light absorbing material comprises a sub-stoichiometric inorganic material having a refractive index above or equal to 1.55.

4. The optical article according to claim 3, wherein said sub-stoichiometric inorganic material is SiN$_x$, where x is a predetermined number lower than 1 or SiO$_x$, where x is a predetermined number lower than 2.

5. The optical article according to claim 1, wherein said at least one layer of light absorbing material comprises a material selected from a group consisting of nickel oxide, silicon oxide, tungsten oxide and titanium oxide.

6. The optical article according to claim 1, wherein said base material has a visible light mean transmission factor above 95%.

7. The optical article according to claim 1, wherein said optical article is an ophthalmic lens, a device having a safety wall intended to face an individual's eye, an optical filter, or an optical film or patch intended to be fixed on a substrate.

8. Sunglasses, wherein said sunglasses comprise at least one optical article according to claim 1.

9. A method for manufacturing an optical article of claim 1 comprising depositing on said base material a predetermined thickness of said at least one layer of light absorbing material.

10. The method according to claim 9, wherein said coating further comprises at least one layer having a refractive index below 1.5 and wherein the extinction coefficient of said at least one layer of light absorbing material is above or equal to 0.1.

11. The method according to claim 9, wherein said at least one layer of light absorbing material comprises a sub-stoichiometric inorganic material having a refractive index above or equal to 1.55 and wherein said depositing comprises using a chemical or physical vapor deposition technique.

12. The method according to claim 11, wherein said sub-stoichiometric inorganic material is $SiN_x$, where x is a predetermined number lower than 1 or $SiO_x$, where x is a predetermined number lower than 2.

13. The method according to claim 9, wherein said depositing comprises magnetron sputtering using a silicon target.

14. The method according to claim 9, wherein said at least one layer of light absorbing material comprises a material selected from a group consisting of nickel oxide, silicon oxide, tungsten oxide and titanium oxide.

15. The method according to claim 9, wherein said base material has a visible light mean transmission factor above 95%.

* * * * *